(12) United States Patent
Kawai et al.

(10) Patent No.: US 6,376,977 B1
(45) Date of Patent: Apr. 23, 2002

(54) SILICON ELECTRODE PLATE

(75) Inventors: Makoto Kawai; Keiichi Goto; Kazuyoshi Tamura; Yoshihiro Kubota; Toshimi Kobayashi, all of Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 140 days.

(21) Appl. No.: 09/580,638

(22) Filed: May 30, 2000

(30) Foreign Application Priority Data

Jun. 8, 1999 (JP) .......................... 11-160963

(51) Int. Cl.$^7$ ............................. G01M 11/02; H01J 1/05
(52) U.S. Cl. .................. 313/352; 313/311; 313/633; 428/149; 428/312.6; 428/446; 204/280; 204/291
(58) Field of Search .................. 313/326, 348, 313/352, 311, 633; 428/49, 149, 210, 241, 266, 312.6, 325, 391, 405, 446; 204/280, 291

(56) References Cited

U.S. PATENT DOCUMENTS 3,676,371 A * 7/1972 Zollner et al. .......... 204/291 X
5,448,883 A * 9/1995 Meserole, Jr. et al. ...... 313/348

FOREIGN PATENT DOCUMENTS

| JP | 57-185982 | 11/1982 |
| JP | 62-85430 | 4/1987 |
| JP | 62-109317 | 5/1987 |
| JP | 2-20018 | 1/1990 |
| JP | 6-177076 | 6/1994 |
| JP | 7-335635 | 12/1995 |
| JP | 9-129605 | 5/1997 |
| JP | 10-17393 | 1/1998 |

OTHER PUBLICATIONS

F. Shimura et al., Nitrogen Effect on Oxygen Precipitation in Czochralski Silicon, Appl. Phys. Lett. 48 (3), pp. 224–226, Jan. 1986.

* cited by examiner

Primary Examiner—Ashok Patel
(74) Attorney, Agent, or Firm—Oliff & Berridge, PLC

(57) ABSTRACT

There is disclosed a silicon electrode plate including silicon single crystal used as an upper electrode in a plasma etching apparatus wherein concentration of interstitial oxygen contained in the silicon electrode plate is not less than $5 \times 10^{17}$ atoms/cm$^3$ and not more than $1.5 \times 10^{18}$ atoms/cm$^3$, and the silicon electrode plate wherein nitrogen concentration in the silicon electrode plate is not less than $5 \times 10^{13}$ atoms/cm$^3$ and not more than $5 \times 10^{15}$ atoms/cm$^3$. There can be provided a silicon electrode plate consisting of silicon single crystal used as an upper electrode in a plasma etching apparatus wherein problems due to adhesion of impurities such as heavy metal or the like can be prevented.

4 Claims, 1 Drawing Sheet

SILICON ELECTRODE PLATE

BACKGROUND OF THE INVENTION

1. Field of the Invention

The present invention relates to an electrode for plasma etching, for example, used for a dry etching apparatus used in a process of fabricating a semiconductor device.

2. Description of the Related Art

As one of processes of fabricating a semiconductor device, there is a dry etching process that is one of processes of forming a circuit pattern on a silicon wafer. For example, when a parallel plate plasma etching apparatus is used, a silicon wafer to be treated is placed on a lower electrode, and RF Plasma is generated between the lower electrode and an upper electrode that is parallel thereto, having a lot of fine pores for passing of a reaction gas, so that the silicon wafer can be etched. In that case, the upper electrode itself is also etched by plasma while the silicon wafer is etched.

Conventionally, as shown in Japanese Patent. Application Laid-open (kokai) No.57-185982, the upper electrode has been made of graphite material highly purified, which is conductive and chemically stable, and scarcely contaminates silicon wafers with metal impurities. However, since the graphite material is complex of particles consisting of aggregate and matrix, there may be caused problems, such as a problem that constitutive particles drop therefrom due to plasma etching, resulting in large consumption of the material, a problem that the particles may drop on the silicon wafer to be treated, which may lead to trouble in formation of circuit pattern, or the like. To solve those problems, glassy carbon has been recently used as an upper electrode as shown in Japanese patent application laid open (Kokai) No.62-109317.

However, even if the glassy carbon is used as the upper electrode, the silicon wafer cannot be prevented from being contaminated. In fabrication of a semiconductor device, contamination of a silicon wafer may lead to degradation of performance, resulting in lowering of yield of the device. Accordingly, it has been proposed that a silicon single crystal that is the same as those used for a silicon wafer as a material of the upper electrode is used in place of a glassy carbon that may cause contamination, in Japanese patent application laid open (Kokai) No.62-85430, Japanese patent application laid open (Kokai) No.2-20018, Japanese patent application laid open (Kokai) No.6-177076, Japanese patent application laid open (Kokai) No.7-335635, Japanese patent application laid open (Kokai) No.9-129605, Japanese patent application laid open (Kokai) No.10-17393 or the like.

However, even if the upper electrode is made of single crystal silicon to keep high purity as a whole, adhesion of impurities into fine pores or the like is inevitable, since a silicon single crystal plate produced by slicing a single crystal silicon ingot is subjected to electrical discharge machining, ultrasonic machining, diamond drill machining or the like in order to make fine pores therein. Furthermore, adhesion of impurities from a polishing apparatus on the surface of the upper electrode during polishing is also inevitable. These are mainly heavy metal impurities, which are also generated from materials or tools used in each of processing apparatuses. Such heavy metal impurities may cause serious problems in a semiconductor device process, even if they exist in only slight amount. Namely, if the upper electrode to which impurities adhere is used without any treatment, the impurities drop on the silicon wafer. As a result, there may be caused a problem of lowering of yield of the semiconductor device fabricated on the silicon wafer.

Furthermore, such heavy metal impurities adhered to the upper electrode are not only adhered on the surface of the silicon electrode plate, but also diffused to an inner part thereof, resulting in generation of defects.

Such heavy metal impurities can be confirmed as small pits by breaking a silicon electrode plate to which impurities are adhered, subjecting the broken section to Secco etching or the like and observing it with a microscope.

Such defects due to impurities in a surface part of the silicon electrode plate may also cause problems while the silicon electrode plate is used. The problems will be hereunder explained more in detail. The silicon electrode plate itself is consumed on their surface as it is used, since it is also etched by plasma. In that case, defects due to impurities in a surface part of the silicon electrode plate are etched at high etching rate to form pits. Furthermore, temperature gets higher due to plasma in the part of the silicon electrode plate, the part of which is in contact with plasma. The small pits in the above-mentioned defect parts due to impurities will aggregate due to such high temperature, and become large pits that can be confirmed with the naked eye. If the silicon electrode plate is consumed, the large pits will be exposed. As a result, the surface of the plate will be in the state as if it is roughed. If the surface of the silicon electrode plate is roughed up, the figure of the roughness will be transcribed on the silicon wafer to be subjected to plasma etching. The transcribed figure of roughness may lead to difference in an etching rate, which may cause the lowering of yield of a device to be fabricated on the silicon wafer.

SUMMARY OF THE INVENTION

The present invention has been accomplished to solve the above-mentioned problems, and an object of the present invention is to provide a silicon electrode plate made of silicon single crystal that is used as an upper electrode in a plasma etching apparatus wherein problems due to adhesion of impurities such as heavy metal or the like can be prevented.

To achieve the above object, the present invention provides a silicon electrode plate comprising silicon single crystal used as an upper electrode in a plasma etching apparatus wherein concentration of interstitial oxygen contained in the silicon electrode plate is not less than $5 \times 10^{17}$ atoms/cm$^3$ and not more than $1.5 \times 10^{18}$ atoms/cm$^3$.

As described above, when a silicon electrode plate wherein concentration of interstitial oxygen contained in the silicon electrode plate is not less than $5 \times 10^{17}$ atoms/cm$^3$ and not more than $1.5 \times 10^{18}$ atoms/cm$^3$ is used, for example, as an upper electrode in a plasma etching apparatus, oxygen is precipitated in a sufficient amount in a bulk part of the electrode plate at a high temperature. As a result, so-called intrinsic gettering effect (IG effect) wherein impurities such as harmful heavy metal adhered to the silicon electrode plate are captured can be sufficiently achieved. Accordingly, the electrode plate has a gettering effect, and there can be prevented problems such as a drop of the adhered impurities on a silicon wafer to be treated. Furthermore, defects in a surface part of the silicon electrode plate can be controlled by the gettering effect, so that roughness of the surface can be reduced. Moreover, if oxygen concentration is in the above-mentioned range, defects due to oxygen precipitation such as OSF (oxidation induced stacking fault) which excessive oxygen precipitation causes during use of the plate are not caused. As a result, roughness of the surface of the electrode plate caused thereby can also be prevented. Accordingly, the surface roughness is never transcribed on the silicon wafer to be treated.

In that case, nitrogen concentration in the silicon electrode plate is preferably not less than $5\times10^{13}$ atoms/cm$^3$ and not more than $5\times10^{15}$ atoms/cm$^3$.

As described above, if nitrogen concentration in the silicon electrode plate is not less than $5\times10^{13}$ atoms/cm$^3$ and not more than $5\times10^5$ atoms/cm$^3$, oxygen precipitation in a bulk part of the silicon electrode plate is suitably promoted, and thus the gettering effect can be more effective.

In that case, the surface of the silicon electrode plate is preferably subjected to etching treatment.

As described above, if the surface of the silicon electrode plate is subjected to etching treatment, a work damage layer generated during manufacturing and processing of the silicon electrode plate can be removed, and surface roughness of the silicon electrode plate can be removed. As a result, a problem that figure of the roughness is transcribed on the silicon wafer to be treated can be prevented.

As described above, according to the present invention, since concentration of interstitial oxygen contained in a silicon electrode plate made of silicon single crystal used as an upper electrode in a plasma etching apparatus is not less than $5\times10^{17}$ atoms/cm$^3$ and not more than $1.5\times10^{18}$ atoms/cm$^3$, a sufficient gettering effect is afforded to the silicon electrode plate. Accordingly, disadvantages due to impurities such as heavy metal or the like can be prevented, and yield in production of a semiconductor device can be improved.

DESCRIPTION OF THE INVENTION AND A PREFERRED EMBODIMENT

Figure 1:
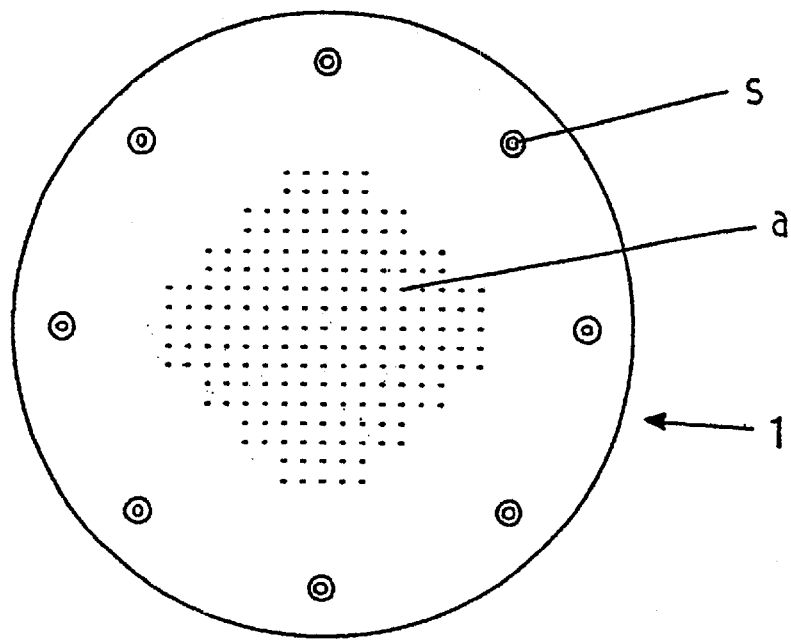
FIG. 1 is a plan view of one example of the silicon electrode plate according to the present.

The present invention will be further described below in detail.

The present inventors have found that in a silicon electrode plate made of silicon single crystal used, for example, as an upper electrode in a plasma etching apparatus, if optimum concentration of interstitial oxygen contained in the silicon electrode plate is chosen, sufficient gettering effect can be achieved in the silicon electrode plate, and thus problems caused by adhesion of impurities such as heavy metal or the like to the silicon electrode plate can be prevented, and have studied various conditions further to complete the present invention.

Namely, when a silicon electrode plate containing interstitial oxygen in a suitable amount is used for a plasma etching apparatus, the temperature of the silicon electrode plate gets high since it is in contact with plasma of high temperature. Thereby, interstitial oxygen contained therein is precipitated to form precipitates, and a gettering effect can be achieved. Impurities such as heavy metal adhered to the silicon electrode plate and defects in the surface part of the electrode plate are captured in a gettering sink in a bulk part of the silicon electrode plate. As a result, roughness of the surface of the electrode plate can be reduced.

Conventionally, it has been known that an oxygen precipitation induced bulk fault due to interstitial oxygen can be an effective gettering sink in Intrinsic gettering. The inventors of the present invention have thought of possibility of applying gettering used in fabrication of a device to a silicon electrode plate in a plasma etching apparatus, and made a lot of experiments and investigated as for a relation between concentration of interstitial oxygen and gettering effect.

As a result, it has been found that, if concentration of interstitial oxygen in a silicon electrode plate is not less than $5\times10^{17}$ atoms/cm$^3$, an adequate amount of oxygen precipitates are generated when the electrode plate is used, and sufficient gettering effect can be achieved. However, if concentration of interstitial oxygen is more than $1.5\times10^{18}$ atoms/cm$^3$, defects due to oxygen precipitation such as OSF (oxidation induced stacked fault) or the like are sometimes generated, which may lead to roughening surface of the silicon electrode plate. Accordingly, concentration of interstitial oxygen of the silicon electrode plate should be not less than $5\times10^{17}$ atoms/cm$^3$ and not more than $1.5\times10^{18}$ atoms/cm$^3$.

Furthermore, it is known that nitrogen atoms in the silicon single crystal has an effect of increasing oxygen precipitation (for example, F. Shimura and R. S. Hockett, Appl. Phys. Lett. 48, 224, 1986). Accordingly, the inventors of the present invention have thought of achieving more effective gettering effect by allowing the silicon electrode plate to contain nitrogen in an adequate amount to increase oxygen precipitation in a bulk part of the silicon electrode plate.

The inventors made experiments and investigation as for a relation between nitrogen concentration in a silicon electrode plate and a gettering effect to find that, if nitrogen concentration in the silicon electrode plate is $5\times10^{13}$ atoms/cm$^3$ or more, a sufficient effect of increasing oxygen precipitation can be achieved, and more effective gettering effect can be achieved. However, it was also known that in case nitrogen concentration was more than $5\times10^{15}$ atoms/cm$^3$, an excessive oxygen precipitation caused a lot of defects due to oxygen precipitation such as OSF, so that surface of the silicon electrode plate might become rough. Furthermore, if nitrogen concentration is more than $5\times10^{15}$ atoms/cm$^3$ that is solid solubility limit in a silicon single crystal, monocrystallization of the silicon single crystal itself may be inhibited during growth of the silicon single crystal constituting the electrode plate according to Czochralski method etc. Accordingly, the inventors defined more preferable nitrogen concentration in the silicon electrode plate to be not less than $5\times10^{13}$ atoms/cm$^3$ and not more than $5\times10^{15}$ atoms/cm$^3$.

The present invention has been accomplished by further studying on the basis of the findings described above.

Embodiments of the present invention will now be described. However, the present invention is not limited thereto.

Concentration of interstitial oxygen contained in the silicon electrode plate of the present invention is in the range of not less than $5\times10^{17}$ atoms/cm$^3$ and not more than $1.5\times10^{18}$ atoms/cm$^3$. Such concentration of interstitial oxygen can be achieved by the following method.

When a silicon single crystal ingot constituting a silicon electrode plate is pulled according to Czochralski method, a polycrystalline silicon of raw material is first molten to prepare a silicon melt. A silicon is molten, generally in a quartz crucible. In that case, when the silicon is molten in the quartz crucible, the surface of the quartz crucible in contact with the silicon melt is molten into the silicon melt, and oxygen is mixed therein. By adjusting the number of rotation of the crucible while the ingot is pulled from the silicon melt, an amount of oxygen that is molten and mixed into the silicon melt can be controlled, and thereby, concentration of interstitial oxygen in the silicon single crystal can be easily controlled.

The oxygen concentration can also be easily controlled to be in the above-mentioned range by increasing or decreasing gas volume flowing into a chamber, by increasing or lowering an atmosphere pressure, by controlling temperature distribution and convection of a silicon melt in a crucible or by doing the like.

Concentration of nitrogen contained in the silicon electrode plate is preferably in the range of not less than $5 \times 10^{13}$ and not more than $5 \times 10^{15}$ atoms/cm$^3$. Nitrogen can be introduced by forming a nitride film on a silicon wafer, for example, by CVD method or the like, placing the silicon wafer having the nitride film in a quartz crucible together with a polycrystalline silicon of raw material, and melting them. A nitrogen concentration can be controlled to be in the above-mentioned range by adequately controlling an amount of the nitride film on the silicon wafer to be added in the raw material. Thereby, nitrogen concentration can be controlled quite accurately.

Nitrogen can also be doped in the pulled silicon single crystal by adding nitride itself in a silicon melt, using atmosphere gas containing nitrogen or doing the like. In these cases, a doping amount of nitrogen in the silicon single crystal can be adjusted by controlling an amount of nitride, concentration or time of introduction of nitrogen gas or the like.

As described above, a silicon single crystal ingot having a desired interstitial oxygen concentration and nitrogen concentration can be produced.

The silicon single crystal ingot produced as described above is sliced to have a desired thickness, and subjected to optimal processes adequately selected from fabrication processes such as formation of fine pores and mounting holes or peripheral machining and polishing process for polishing the surface and the like, to produce a silicon electrode plate consisting of silicon single crystal.

In that case, the surface of the silicon electrode plate is preferably etched because a work damage layer sometimes remains on the surface of the silicon electrode plate during a process such as formation of the above-mentioned fine pores or mounting holes, surface polishing or the like, which may lead to a roughened surface of the silicon electrode plate. The figure of the roughened surface of the electrode plate may be sometimes transferred to the silicon wafer to be treated.

Accordingly, the work damage layer remaining on the surface of the electrode plate can be removed by etching the surface of the silicon electrode plate. Any type of etching treatment such as acid etching or alkali etching or the like can be conducted, as far as the surface of the silicon electrode plate can be etched. Furthermore, in a process of fabricating the silicon electrode plate, it is preferable to clean the surface, if desired, with acid etching or alkali etching in order to remove impurities adhered to the surface. Specifically, a mixed acid such as $HF+HNO_3+CH_3COOH$, an aqueous solution of NaOH, KOH or the like can be used.

As described above, the silicon electrode plate of the present invention can be obtained. The silicon electrode plate is, for example, a silicon electrode plate 1 consisting of silicon single crystal as shown in FIG. 1. A lot of fine pores "a" are formed at the center part of the silicon electrode plate 1. Mounting holes "s" for mounting the electrode plate to a plasma etching apparatus are formed at a peripheral part of the silicon electrode plate 1.

Figure 2:
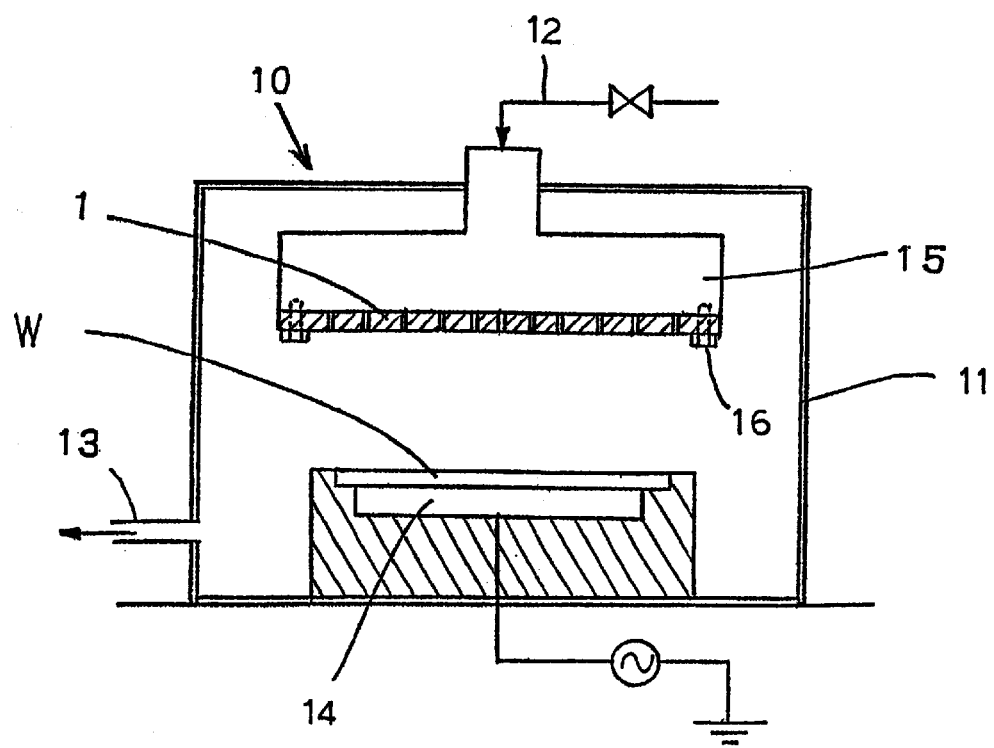
FIG. 2 is a explanatory view of one example of a plasma etching apparatus in which the silicon electrode plate according to the present invention is used.

Such a silicon electrode plate 1 of the present invention is used with being mounted to the plasma etching apparatus 10 shown in FIG. 2 through the mounting holes s with screws 16.

The plasma etching apparatus 10 comprising a chamber 11 to which a gas feed system 12 and a gas exhaust system 13 are connected, a lower electrode 14 that is installed in the chamber 11 and connected to RF power supply, and a silicon electrode plate 1 facing it. The silicon electrode plate 1 is attached to the lower surface of the inner gas chamber 15 that is connected to a gas feed system 12 through the above-mentioned holes s. A reaction gas sent to the inner gas chamber 15 through the gas feed system 12 is emitted downward through the fine pores a.

Then, the silicon wafer W to be treated is loaded on the lower electrode 14 to which RF electric power is applied. A surface of the silicon wafer W is etched by generating plasma by means of discharge between the lower electrode 14 and the silicon electrode plate 1 facing it.

During the above-mentioned etching treatment, the silicon electrode plate 1 of the present invention has a sufficient gettering effect, since the interstitial oxygen concentration thereof is in a suitable range. Accordingly, if impurities such as heavy metal are adhered to the surface during processing steps, or inside of the plasma etching apparatus is contaminated with heavy metal, impurities such as heavy metal can be introduced into the bulk part of the electrode plate 1. Accordingly, there can be prevented problems such as contamination caused by fall of impurities onto the silicon wafer W.

Furthermore, defects in the surface part of the silicon electrode plate can also be prevented in the silicon electrode plate 1 of the present invention. Accordingly, even if the silicon electrode plate 1 is used continuously for a long time, the surface of the electrode plate 1 can be prevented from being roughened. Accordingly, transcription of roughness of the electrode plate to the silicon wafer W can be prevented, and difference in etching rate can also be prevented.

EXAMPLE

Examples and Comparative examples will be explained below.

Examples 1 to 4, Comparative Examples 1 to 4

The silicon electrode plate as shown in FIG. 1 was produced by the following method.

In accordance with CZ method, silicon polycrystalline of raw material was charged into a quartz crucible having a diameter of 36 inches, and eight single crystal ingots of P type and 0.1 Ω·cm having a diameter of 12 inches were pulled. Any of crystals were pulled with varying oxygen concentration in the single crystal by controlling the number of rotation of the crucible during pulling. Any of crystals were pulled with varying nitrogen concentration in the single crystal by charging the silicon wafer having nitride film of which thickness are different from each other in advance into the raw material.

The eight silicon single crystal ingots having a diameter of about 300 mm pulled as described above were subjected to a cylindrical grinding. Subsequently, the electrode plate material having a thickness of 6 mm was sliced therefrom, and a peripheral part thereof was chamfered to produce a material having a diameter of 280 mm. Mounting holes for mounting it in a plasma etching apparatus were formed at a peripheral part of the electrode plate, and fine pores for emitting gas material were formed at a center part of the electrode plate. Then, the surface of each of the silicon electrode plates was etched with $HF+HNO_3+CH_3COOH$ to remove the work damage layer generated during processing.

Eight kinds of the silicon electrode plates thus obtained were mounted in the plasma etching apparatus as shown in FIG. 2, and a silicon wafer was subjected to dry etching therein. The state of contamination of the silicon wafer after the treatment and surface roughness of the silicon electrode plate after being used were evaluated.

The results of the measurement were shown in Table 1.

TABLE 1

| | Interstitial oxygen concentration (atoms/cm$^3$) | Nitrogen concentration (atoms/cm$^3$) | State of contamination in Wafer | State of roughness of surface of silicon electrode plate |
|---|---|---|---|---|
| Example 1 | $5 \times 10^{17}$ | $1 \times 10^{13}$ | ○ | ○ |
| Example 2 | $1.5 \times 10^{18}$ | $1 \times 10^{13}$ | ○ | ○ |
| Example 3 | $5 \times 10^{17}$ | $5 \times 10^{13}$ | ⊙ | ⊙ |
| Example 4 | $1.5 \times 10^{18}$ | $5 \times 10^{15}$ | ⊙ | ⊙ |
| Comparative Example 1 | $4.9 \times 10^{17}$ | $1 \times 10^{13}$ | X | X |
| Comparative Example 2 | $1.6 \times 10^{18}$ | $1 \times 10^{13}$ | Δ | X |
| Comparative Example 3 | $4.9 \times 10^{17}$ | $4.9 \times 10^{13}$ | X | X |
| Comparative Example 4 | $1.6 \times 10^{18}$ | $5.1 \times 10^{15}$ | Δ | X |

In Table 1, Examples 1 to 4 show results of etching treatment using the silicon electrode plates of the present invention. Comparative examples 1 to 4 show results in the case that the silicon electrode plates wherein concentration of oxygen or nitrogen are not in the range of the present invention was used.

Evaluation of the state of contamination in Table 1 was conducted on the basis of the following criterion. As for influence of contamination of the silicon electrode plate on the wafer, x represents quite large one, Δ represents large one, ○ represents so small one that there is no problem and ⊙ represents almost no influence. As for degree of surface roughness on the surface of the silicon electrode plate, x represents quite large one, Δ represents large one, ○ represents so small one that there is no problem, and ⊙ represents almost no surface roughness.

As shown in Table 1, when the silicon electrode plate of the present invention wherein concentration of interstitial oxygen contained in the silicon electrode plate is not less than $5 \times 10^{17}$ atoms/cm$^3$ and is not more than $1.5 \times 10^{18}$ atoms/cm$^3$ is used, as in Examples 1 to 4, contamination of the wafer to be treated can be reduced, and surface roughness of the surface of the silicon electrode plate can be reduced. Namely, deviation of etching rate due to transcription of roughness or the like can be prevented.

Especially, when a silicon electrode plate contains adequate amount of nitrogen as shown in Examples 3 and 4, contamination of the wafer and surface roughness of the surface of the silicon electrode plate can be further reduced.

As shown in Comparative examples 1 to 4, it is apparent that, in the silicon electrode plate that are not in the scope of the present invention, influence of contamination of the silicon electrode plate on the wafer is large. The surface of the silicon electrode plate was badly roughed, and the surface roughness of the silicon electrode plate was transcribed on the wafer. Accordingly, it can be estimated that deviation of the etching rate may be large in that case.

The present invention is not limited to the above-described embodiments. The above-described embodiments are mere examples, and those having the substantially same structure as that described in the appended claims and providing the similar action and effects are included in the scope of the present invention.

What is claimed is:

1. A silicon electrode plate comprising silicon single crystal used as an upper electrode in a plasma etching apparatus wherein concentration of interstitial oxygen contained in the silicon electrode plate is not less than $5 \times 10^{17}$ atoms/cm$^3$ and not more than $1.5 \times 10^{18}$ atoms/cm$^3$.

2. The silicon electrode plate according to claim 1 wherein nitrogen concentration in the silicon electrode plate is not less than $5 \times 10^{13}$ atoms/cm$^3$ and not more than $5 \times 10^{15}$ atoms/cm$^3$.

3. The silicon electrode plate according to claim 1 wherein the surface of the silicon electrode plate is subjected to etching treatment.

4. The silicon electrode plate according to claim 2 wherein the surface of the silicon electrode plate is subjected to etching treatment.

* * * * *